United States Patent
Basol et al.

(10) Patent No.: US 7,129,165 B2
(45) Date of Patent: Oct. 31, 2006

(54) METHOD AND STRUCTURE TO IMPROVE RELIABILITY OF COPPER INTERCONNECTS

(75) Inventors: Bulent M. Basol, Manhattan Beach, CA (US); Homayoun Talieh, San Jose, CA (US)

(73) Assignee: ASM Nutool, Inc., Phoenix, AZ (US)

( * ) Notice: Subject to any disclaimer, the term of this patent is extended or adjusted under 35 U.S.C. 154(b) by 0 days.

(21) Appl. No.: 10/858,766

(22) Filed: Jun. 1, 2004

(65) Prior Publication Data

US 2004/0219779 A1    Nov. 4, 2004

Related U.S. Application Data

(63) Continuation-in-part of application No. 10/358,565, filed on Feb. 4, 2003, now Pat. No. 6,861,354.

(60) Provisional application No. 60/474,423, filed on May 29, 2003.

(51) Int. Cl.
    *H01L 21/44*   (2006.01)
    *H01L 21/4763* (2006.01)
(52) U.S. Cl. ............... 438/663; 438/638; 438/643; 438/687
(58) Field of Classification Search ........... 438/638, 438/643, 663, 687
    See application file for complete search history.

(56) References Cited

U.S. PATENT DOCUMENTS

| | | | |
|---|---|---|---|
| 6,297,154 B1 * | 10/2001 | Gross et al. | 438/663 |
| 6,342,447 B1 | 1/2002 | Hoshino | |
| 6,524,950 B1 | 2/2003 | Lin | |
| 6,720,248 B1 * | 4/2004 | Ryo | 438/622 |

OTHER PUBLICATIONS

Shannon et al., "Copper Interconnects for High-Volume Manufacturing," *Semiconductor International*, Novellus Systems Inc., San Jose, CA, May 1, 2001.

* cited by examiner

*Primary Examiner*—Hung Vu
(74) *Attorney, Agent, or Firm*—Knobbe Martens Olson & Bear LLP

(57) ABSTRACT

A method of forming a conductor structure on a surface of a wafer is provided. The surface of the wafer includes cavities separated by field regions. Initially, a barrier layer is deposited on the surface that includes cavities separated by field regions. A thin seed layer with a substantially uniform thickness is deposited on the barrier layer. The barrier layer and the seed layer portions in the cavities occupy less than 30% of the volume of each cavity. The remaining volume of each cavity is filled with a conductive material which is formed on the seed layer. The conductive layer has a substantially small thickness. After forming the conductive layer, the wafer is annealed to increase grain size in the conductive layer and the seed layer.

21 Claims, 2 Drawing Sheets

METHOD AND STRUCTURE TO IMPROVE RELIABILITY OF COPPER INTERCONNECTS

RELATED APPLICATIONS

This application claims priority from Provisional Application Ser. No. 60/474,423 filed May 29, 2003 (NT-299 P), this application is a continuation in part of U.S. application Ser. No. 10/358,565 (NT-246), filed Feb. 4, 2003 now U.S. Pat. No. 6,861,354.

FIELD

The present invention generally relates to semiconductor integrated circuit manufacturing, and more particularly to a method for electroplating copper on a semiconductor wafer to form copper interconnects.

BACKGROUND

Conventional semiconductor devices generally include a semiconductor substrate, usually a silicon substrate, and a plurality of sequentially formed dielectric layers such as silicon dioxide and conductive paths or interconnects made of conductive materials. Interconnects are usually formed by filling a conductive material such as copper in trenches etched into the dielectric layers. In an integrated circuit, multiple levels of interconnect networks laterally extend with respect to the substrate surface. Interconnects formed in different layers can be electrically connected using vias or contacts.

The filling of copper into features such as vias, trenches, pads or contacts, can be carried out by electrodeposition. In electrodeposition or electroplating method, copper is deposited over the substrate surface including such features. As exemplified in FIG. 1, a substrate 10, for example a silicon wafer may have features, such as a via 12 and trenches 14 or other features of interest, etched into an insulating layer 16 on the substrate. Such features may form the wiring lines of an integrated circuit. The features and the top surface 18 (field region) of the insulating layer 16 are then coated with a suitable barrier layer and a seed layer. Exemplary barrier layer materials may be TaN, TaN/Ta and TiN, etc., and their various combinations. After the barrier layer deposition, a seed layer is typically coated on the barrier layer. For copper interconnect applications, a thin seed layer of copper or copper alloy is deposited over the barrier layer. Thickness of the seed layer is typically 50 to 100 nm. After the seed layer deposition step, the features are filled with a copper layer using an electroplating process. The plating process, in addition to filling the features with copper, also deposits excess copper over the top surface of the substrate. This excess copper is called an "overburden" and is removed after heat-treating it. After an annealing step, a material removal technique such as chemical mechanical polishing, electrochemical mechanical polishing, electropolishing, and chemical etching may be employed to planarize and remove the excess copper and barrier from the top surface, leaving conductors only in the features or cavities. In standard plating processes, this overburden copper is thicker than the depth of the features and has a large topography since large features on the wafer are coated in a conformal manner. For example, a wafer with 0.5 micron deep features may be coated with 0.8 micron thick copper by the standard ECD process, to assure complete, defect-free filling of all the features, including those that are wider than about 5 microns. The resulting copper surface then may have a topography that has a step of about 0.5 microns over the large features.

Conventionally, after the annealing, CMP process is employed to first globally planarize this topographic surface and then to reduce the thickness of the overburden copper layer down to the level of the surface of the barrier layer, which is also later removed leaving conductors only in the cavities. However, CMP is a costly and time consuming process and high pressures used in the CMP processes also damage low-k dielectrics, which are mechanically weaker than the silicon oxide. Therefore, minimizing CMP step in an integration process is a goal for all IC manufacturers. The topography on the wafers also causes problems for the CMP process. Specifically, the large steps such as the 0.5 micron step of the above example over the large features such as 100 micron wide trenches or bond-pads, cause dishing defects after CMP. Therefore, both in terms of cost and enabling features, it is very attractive to have thinner copper deposits with reduced surface topography on wafers.

Regardless of their thickness, however, plated films need to be annealed subsequent to copper plating process to stabilize their micro-structure by grain growth and re-crystallization. Larger grain size reduces the electrical resistivity of the copper film and improves its electromigration properties. Structures with larger grain size have lower electrical resistivity and lower density of grain boundaries, thus they are desirable. Conventionally, a copper plated substrate is generally annealed at temperatures, typically between 90° C. to 450° C., for a period of time, which may vary from a few seconds to 4 hours. In general, during the anneal, thickness of the copper overburden affects the grain growth and re-crystallization of the copper film within the features. If the copper overburden is thick, annealing process produces large grain size. Similarly, thin copper layer produces small grain size copper. However, as described above, thick overburden increases the cost of CMP process, and therefore; it is not economic.

As the thickness of the copper deposits is reduced, the impact of the nature of the barrier and seed layers and the seed layer thickness on the grain size of the interconnect becomes dominant. FIG. 2 is a schematic view of the via 12 having a thin copper overburden. As shown in FIG. 2, a barrier layer 20 is formed, using conventional deposition methods, to cover the walls and the bottom of the via 12 and the field region 18. Typical barrier layer thickness is in the range of 10–30 nm. After forming the barrier layer 20, a copper seed layer 22 is coated on the barrier layer. Conventional seed layer deposition methods results in thicker seed layers ($T_{Seed1}$) over the field regions for example seed layers having 100 nm thickness. After the seed layer deposition a copper layer 24 is electroplated into the via and over the field region. Thickness of the copper layer ($T_{Cu}$) deposited on the seed layer at the field region is kept for example in the range of the 100 nm.

As mentioned before, with such thin copper layers, the effect of the seed layer on the grain size of the electroplated interconnect during the anneal becomes dominant. Seed layers inherently have small grain size and therefore have higher electrical resistivity. Especially in the vias and narrow trenches, thicker seed layers increase the volume of small grain size copper in the overall volume of the interconnect. As shown in FIG. 2, barrier and seed layers also occupy a significant volume of the thin overburden layer. Although the annealing process may induce grain growth in the seed layer along with the grain growth in the electroplated copper, the rate of grain growth in the seed layer is significantly lower. In FIG. 2, since about 50% of the overburden film is seed layer, grain growth in the overburden film will be limited. This limited grain growth would also affect grain growth within the feature in a negative way.

A much higher annealing temperature will be needed to fully transform the copper in the seed layer and the plated layer. As mentioned above, while higher temperature may be required to anneal such structures having thin overburden layers, high temperature anneals often result in higher stress. As the aspect ratio of the vias increases, via pullout type of defects become more wide spread. Such via separation from the underlying structure results in very high contact resistance and poor interconnect yield.

SUMMARY

The present invention provides a conductive structure manufactured using electrodeposited conductive material layers with thin overburden formed on reduced thickness seed layers.

DETAILED DESCRIPTION

In general, aspects of the present invention provide a device structure manufactured using electrodeposited conductive material layers with thin overburden formed on reduced thickness seed layers. The present invention will be described below in reference to forming electroplated copper layers on very thin barrier and copper seed layers. Electroplating processes defined herein may be electrochemical mechanical deposition (ECMD) process or electrochemical deposition process (ECD).

Figure 3:
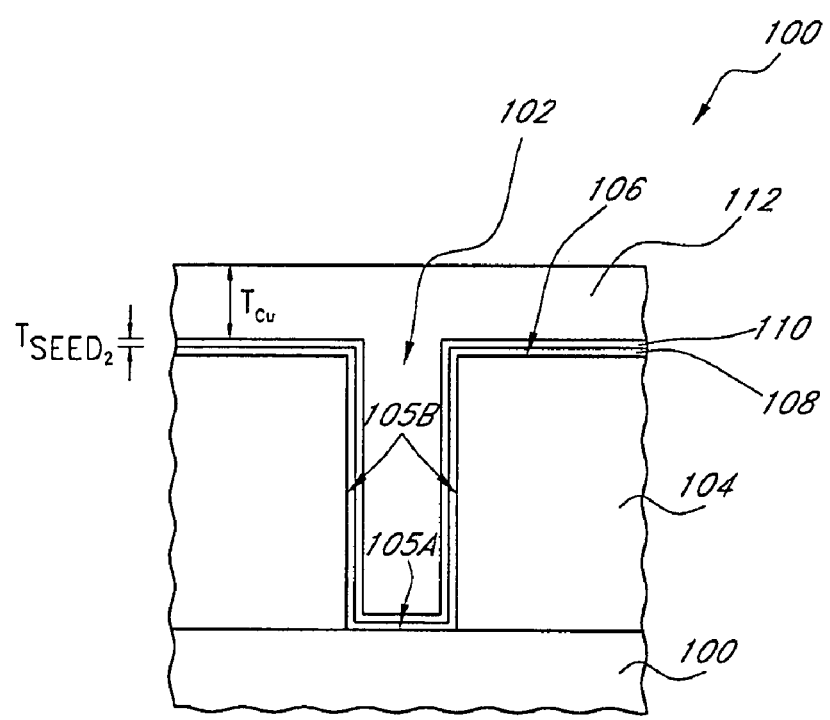
FIG. 3 is a schematic illustration of a conductive structure of the present invention formed in via using the process of the present invention.

FIG. 3 shows a portion of a semiconductor substrate 100 having a via 102 formed in a dielectric layer 104 that is previously formed on the substrate 100. The via or via opening is defined with a bottom 105A wall side walls 105B. The substrate 100 is an exemplary portion of a semiconductor wafer (not shown). The semiconductor substrate may include a plurality of features such as vias and trenches. The via 102 may be a via with an aspect ratio range of 3–15, having a depth range of 0.2–1.6 microns and a width range of 0.03–0.3 microns. In this embodiment, the via 102 and field region 106 or the surface of the dielectric layer 104 are coated with a barrier layer 108, such as WN, WCN, TiN, Ta and/or TaN layer, and then a seed layer 110. In this embodiment, the thickness of the barrier layer may be in the range of 1–10 nm. The barrier layer may be deposited using well-known deposition techniques such as PVD or ALD. The thickness $T_{seed2}$ of the seed layer is less than 30 nm and preferably between 5 to 20 nm. The seed layer can be deposited using a CVD or ALD technique.

The seed layer and the barrier layer of the present invention are layers with uniform thickness and extend uniformly on the field regions or on the cavity walls 105A. After the seed layer deposition, a copper layer 112 is electroplated on the seed layer. Thickness $T_{Cu}$ of the copper layer 112 on the seed layer portion, or overburden that coats the field region 106 is kept for example in the range of 100–200 nm. Reduction of seed layer thickness makes plated portion of the copper overburden dominant during the annealing process. Further, reduced thickness of the seed layer allows more copper deposition into the feature 102 and therefore more plated copper in the via. As described above, large grain copper has lower electrical resistivity, and it is therefore preferred. In this respect, when the cavity is completely is filled by the copper, copper forms about more than 70% of the volume of the via. About less than 30% of the volume of the via is filled by the barrier and seed layers. The copper layer thickness over the field regions is 2 to 20 times the thickness of the seed layer.

Figure 1:
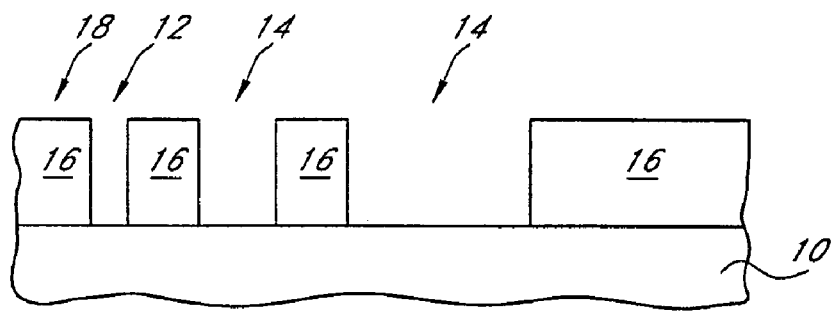
FIG. 1 is a schematic illustration of a substrate having cavities to be filled with conductive materials.
Figure 2:
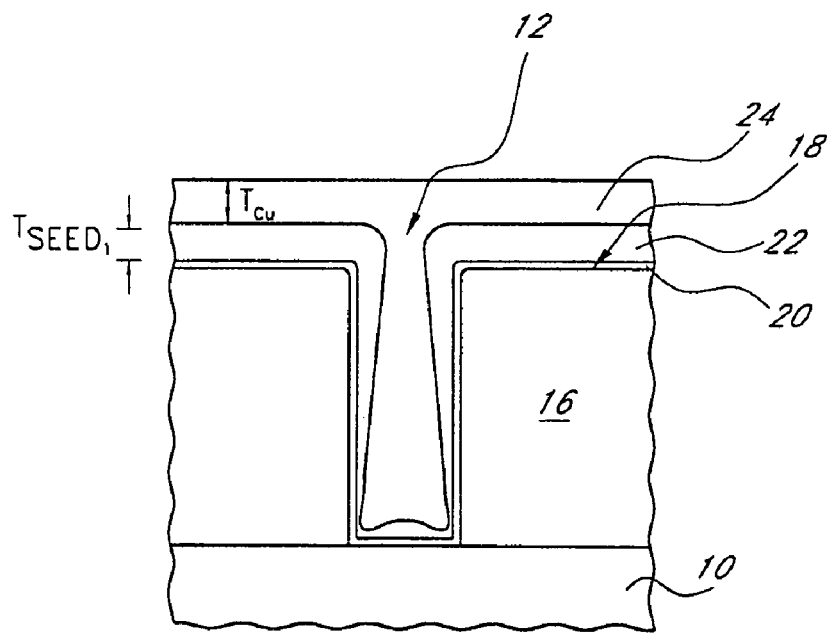
FIG. 2 is a schematic illustration of a conductive structure formed in a via using the prior art process.

When the substrate 100 is annealed, with the above mentioned thickness ranges of the various layers, crystallization and grain growth in the copper layer 112 resulting from the annealing process are much better than the prior art case shown in FIG. 2. This, in turn, promotes better crystallization and grain growth within the feature 102 itself, as well as over the field regions 106 despite the fact that overburden thickness $T_{Cu}$ is small compared to the depth of the features such as less than one third of the feature depth. Due to the reduced volume of the seed layer in the structure, the annealing can be performed at a relatively lower temperature and shorter time. An exemplary annealing temperature range may be 90°–350° C. Annealing may preferably be performed in 200°–300° C. for 10–120 seconds. Such low temperature anneals result in lower stresses in the vias, which prevents via pull out type of defects. Short annealing times allow use of single wafer RTP (rapid thermal processing) approaches. High aspect ratio features are especially prone to such via pullout type of defects in high temperature anneals. Such via separation from the underlying structure results in very high contact resistance and poor interconnect yield.

After the annealing, thin overburden copper and the barrier layer on the field regions may be removed in a short time using a chemical mechanical polishing process, electrochemical mechanical polishing or electrochemical polishing. After removing the barrier layer, the copper with large grains is confined within the via.

In the preferred embodiment of the present invention, planar copper layer is plated using Electrochemical Mechanical Processing (ECMPR). It is understood that plating a planar and thin copper layer prior to annealing step minimizes the resulting stress from the crystallization process, thus preventing the problems associated with via separation or detachment from the structures beneath. ECMPR includes both Electrochemical Mechanical Deposition (ECMD) processes as well as Electrochemical Mechanical Etching (ECME), also called Electrochemical Mechanical Polishing, although ECMD and ECME processes can be used alone or in combination during an ECMPR process. It should be noted that both ECMD and ECME processes are referred to as electrochemical mechanical processing (ECMPR) since both involve electrochemical processes and mechanical action.

In one aspect of an ECMPR process, a workpiece-surface-influencing-device (WSID) such as a mask, pad or a sweeper is used during at least a portion of the process when there is physical contact or close proximity and relative motion between the workpiece surface and the WSID. Descriptions of various planar deposition or planar etching methods and apparatus can be found in the following patents and pending applications, all commonly owned by the assignee of the present invention. U.S. Pat. No. 6,176,992, entitled "Method and Apparatus for Electrochemical Mechanical Deposition". U.S. Pat. No. 6,534,116 entitled "Plating Method and Apparatus that Creates a Differential Between Additive Disposed on a Top Surface and a Cavity Surface of a Workpiece Using an External Influence," filed on Dec. 18, 2001, and U.S. application Ser. No. 09/961,193, filed on Sep. 20, 2001, entitled "Plating Method and Apparatus for Controlling Deposition on Predetermined Portions of a Workpiece", U.S. Pat. No. 6,471,847 entitled "Method for Forming Electrical Contact with a Semiconductor Substrate" and U.S. Pat. No. 6,610,190 entitled "Method and Apparatus for Electrodeposition of Uniform Film with Minimal Edge Exclusion on Substrate," all incorporated herein by reference.

These methods can deposit metals in and over cavity or feature sections on a workpiece or substrate in a planar manner. They also have the capability of yielding novel structures with excess amount of metals over the features irrespective of their size, if desired.

In ECMD methods, the surface of the workpiece is wetted by the electrolyte and is rendered cathodic with respect to an electrode, which is also wetted by the electrolyte. This typically results in conductive material deposition within the features of the workpiece, and a thin layer on the top surface of the workpiece. During ECMD, the wafer surface is pushed against or in close proximity to the surface of the WSID or vice versa when relative motion between the surface of the workpiece and the WSID results in sweeping of the workpiece surface. Planar deposition is achieved due to this sweeping action as described in the above-cited patent applications.

In ECME methods, the surface of the workpiece is wetted by the electrolyte or etching solution, but the polarity of the applied voltage is reversed, thus rendering the workpiece surface more anodic compared to the electrode.

Very thin planar deposits can be obtained by first depositing a planar layer using an ECMD or ECD technique and then using an ECME technique on the planar film in the same electrolyte by reversing the applied voltage. Alternately the ECME step can be carried out in a separate machine and a different etching or polishing electrolyte. The thickness of the deposit may be reduced in a planar manner. In fact, an ECME technique may be continued until all the metal on the field regions is removed. It should be noted that a WSID may or may not be used during the electroetching or polishing process since substantially planar etching can be achieved either way. If the ECD is the plating process, the copper layer is a non-uniform layer having large steps on large features. If the ECMD is the plating process, a planar top layer similar to the one shown in FIG. 3 is obtained.

Although various preferred embodiments and the best mode have been described in detail above, those skilled in the art will readily appreciate that many modifications of the exemplary embodiment are possible without materially departing from the novel teachings and advantages of this invention.

We claim:

1. A method of forming a conductor structure on a surface of a wafer, the surface including cavities separated by field regions, the method comprising:
    depositing a seed layer with a substantially uniform thickness on the field regions and in the cavities of the surface having a barrier layer thereon, wherein the barrier layer and the seed layer portions in the cavities occupy less than 30% of the volume of each cavity;
    forming a conductive layer by electrodepositing a conductive material on the seed layer, wherein the conductive material fills the remaining volume of each cavity and wherein a thickness of the conductive layer over the field regions is between about 100 nm and about 200 nm; and
    annealing the wafer to increase grains size in the conductive layer and the seed layer.

2. The method of claim 1 further comprising the step of reducing the thickness of the conductive layer in a planar manner so that the conductive layer thickness over the field regions is about 2 to 20 times the thickness of the seed layer thickness.

3. The method of claim 2, wherein the thickness of the conductive layer is reduced using a chemical mechanical polishing process.

4. The method of claim 2, wherein the thickness of the conductive layer is reduced using an electrochemical mechanical polishing process.

5. The method of claim 2, further comprising the step of removing the conductive layer until the barrier layer on the field regions is exposed and the conductive material is confined in the cavities.

6. The method of claim 5, further comprising the step of removing the barrier layer from the field regions.

7. The method of claim 1, wherein the step of depositing comprises depositing the seed layer having a thickness in the range of less than 30 nanometers.

8. The method of claim 1, wherein the step of forming the conductive layer is performed using an electrochemical deposition.

9. The method of claim 1, wherein the step of forming the conductive layer is performed using an electrochemical mechanical deposition.

10. The method of claim 1, wherein the conductive material is copper.

11. The method of claim 1, wherein the step of annealing is performed in a temperature range of 200°–300° C.

12. The method of claim 1, wherein the step of annealing is performed using a rapid thermal annealing system processing one wafer at a time.

13. A method of forming a conductor structure on a surface of a wafer, the surface including cavities separated by field regions, the method comprising:
    depositing a seed layer with a substantially uniform thickness on the field regions and in the cavities of the surface having a barrier layer thereon, wherein the barrier layer and the seed layer portions in the cavities occupy less than 30% of the volume of each cavity;
    forming a substantially planar conductive layer by depositing a conductive material on the seed layer, wherein the conductive material fills the remaining volume of each cavity and wherein a thickness of the conductive layer over the field regions is between about 100 nm and about 200 nm and is about 2 to 20 times the thickness of the seed layer thickness; and
    annealing the wafer to form large grains in the conductive layer and the seed layer.

14. The method of claim 13, wherein the step of forming the substantially planar conductive layer is performed using an electrochemical mechanical deposition.

15. The method of claim 13, further comprising the step of removing the planar conductive layer until the barrier layer on the field regions is exposed and the conductive material is confined in the cavities.

16. The method of claim 15, wherein the step of removing the planar conductive layer is performed using a chemical mechanical polishing process.

17. The method of claim 15, further comprising the step of removing the barrier layer from the field regions.

18. The method of claim 13, wherein the step of depositing comprises depositing the seed layer having a thickness in the range of less than 30 nanometers.

19. The method of claim 13, wherein the conductive material is copper.

20. The method of claim 13, wherein the step of annealing is performed in a temperature range of 200°–300° C.

21. The method of claim 13, wherein the step of annealing is performed using a rapid thermal annealing system processing one wafer at a time.

* * * * *